United States Patent
DCamp et al.

(10) Patent No.: US 7,491,567 B2
(45) Date of Patent: Feb. 17, 2009

(54) MEMS DEVICE PACKAGING METHODS

(75) Inventors: Jon B. DCamp, Savage, MN (US); Harlan L. Curtis, Champlin, MN (US)

(73) Assignee: Honeywell International Inc., Morristown, NJ (US)

( * ) Notice: Subject to any disclaimer, the term of this patent is extended or adjusted under 35 U.S.C. 154(b) by 130 days.

(21) Appl. No.: 11/164,449

(22) Filed: Nov. 22, 2005

(65) Prior Publication Data
US 2007/0117275 A1    May 24, 2007

(51) Int. Cl.
| | | |
|---|---|---|
| H01L 21/00 | (2006.01) | |
| H01L 21/50 | (2006.01) | |
| H01L 21/48 | (2006.01) | |
| H01L 21/44 | (2006.01) | |
| H01L 29/84 | (2006.01) | |
| H01L 29/82 | (2006.01) | |
| H01L 27/14 | (2006.01) | |

(52) U.S. Cl. .............. 438/51; 438/50; 438/48; 438/106; 257/415; 257/416; 257/417; 257/414; 257/E27.122

(58) Field of Classification Search .......... 438/51, 438/50, 48, 106; 257/414–417, E27.122
See application file for complete search history.

(56) References Cited

U.S. PATENT DOCUMENTS

| | | | |
|---|---|---|---|
| 4,720,424 A | | 1/1988 | Eickman et al. |
| 4,987,673 A | | 1/1991 | Kogura et al. |
| 5,164,328 A | * | 11/1992 | Dunn et al. ............ 438/51 |
| 5,743,005 A | | 4/1998 | Nakao et al. |
| 5,818,094 A | | 10/1998 | Matsuo |
| 5,864,943 A | | 2/1999 | Arakawa et al. |
| 5,895,233 A | | 4/1999 | Higashi et al. |
| 5,909,915 A | | 6/1999 | Okuda |
| 5,952,572 A | * | 9/1999 | Yamashita et al. ....... 73/504.04 |
| 5,992,013 A | | 11/1999 | Morita |

(Continued)

FOREIGN PATENT DOCUMENTS

EP     1096259 A1    5/2001

(Continued)

OTHER PUBLICATIONS

Gilleo, "MEMS Packaging Assembly Issues," SMTA International 2000 Conference Proceedings, 8 pages, Sep. 24-28, 2000.

(Continued)

*Primary Examiner*—Luan C Thai
(74) *Attorney, Agent, or Firm*—McDonnell Boehnen Hulbert & Berghoff LLP

(57) ABSTRACT

A method of packaging a MEMS device that includes, for example, the steps of providing a MEMS die that has a MEMS device, a seal ring and bond pads disposed thereon, providing a MEMS package that has a recess, a seal ring and bond pads disposed thereon, positioning the MEMS die over the MEMS package to align the seal rings and bond pads, inserting the MEMS die and MEMS package into a vacuum chamber and evacuating gasses therefrom to form a controlled vacuum pressure therein, sealing the MEMS package and the MEMS die together at the seal rings to form a package having a hermetically sealed interior chamber and simultaneously forming electrical connections between the corresponding bond pads.

28 Claims, 5 Drawing Sheets

U.S. PATENT DOCUMENTS

| | | | |
|---|---|---|---|
| 5,992,233 | A | 11/1999 | Clark |
| 6,140,144 | A | 10/2000 | Najafi et al. |
| 6,220,764 | B1 | 4/2001 | Kato et al. |
| 6,225,692 | B1 | 5/2001 | Hinds |
| 6,232,150 | B1 * | 5/2001 | Lin et al. .............. 438/119 |
| 6,238,938 | B1 | 5/2001 | Smith |
| 6,255,739 | B1 | 7/2001 | Adachi et al. |
| 6,294,408 | B1 | 9/2001 | Edwards et al. |
| 6,316,840 | B1 | 11/2001 | Hiroshi |
| 6,335,224 | B1 | 1/2002 | Peterson et al. |
| 6,379,988 | B1 | 4/2002 | Peterson et al. |
| 6,388,203 | B1 | 5/2002 | Rinne et al. |
| 6,441,481 | B1 | 8/2002 | Karpman |
| 6,452,238 | B1 | 9/2002 | Orcutt et al. |
| 6,455,878 | B1 | 9/2002 | Bhat et al. |
| 6,459,150 | B1 | 10/2002 | Wu et al. |
| 6,469,909 | B2 | 10/2002 | Simmons |
| 6,472,739 | B1 | 10/2002 | Wood et al. |
| 6,479,320 | B1 | 11/2002 | Gooch |
| 6,500,760 | B1 | 12/2002 | Peterson et al. |
| 6,519,075 | B2 | 2/2003 | Carr et al. |
| 6,528,351 | B1 | 3/2003 | Nathan et al. |
| 6,536,653 | B2 | 3/2003 | Wang et al. |
| 6,550,337 | B1 | 4/2003 | Wagner et al. |
| 6,555,417 | B2 | 4/2003 | Spooner et al. |
| 6,624,003 | B1 | 9/2003 | Rice |
| 6,635,509 | B1 | 10/2003 | Ouellet |
| 6,640,423 | B1 | 11/2003 | Johnson et al. |
| 6,743,656 | B2 | 6/2004 | Orcutt et al. |
| 6,789,423 | B2 | 9/2004 | An et al. |
| 6,793,209 | B1 | 9/2004 | Roberts |
| 6,838,762 | B2 | 1/2005 | Tao et al. |
| 6,862,934 | B2 | 3/2005 | Weinberg et al. |
| 6,927,098 | B2 | 8/2005 | DCamp et al. |
| 6,936,494 | B2 | 8/2005 | Cheung |
| 2001/0008703 | A1 | 7/2001 | Sakata et al. |
| 2001/0022382 | A1 | 9/2001 | Shook |
| 2001/0027606 | A1 | 10/2001 | Ohkubo et al. |
| 2002/0003819 | A1 | 10/2001 | Kimura et al. |
| 2002/0001873 | A1 | 1/2002 | Kang |
| 2002/0037233 | A1 | 3/2002 | Billiet et al. |
| 2002/0069952 | A1 | 6/2002 | Kurosawa |
| 2002/0075551 | A1 | 6/2002 | Daneman et al. |
| 2002/0089044 | A1 | 7/2002 | Simmons et al. |
| 2002/0089835 | A1 | 7/2002 | Simmons |
| 2002/0089836 | A1 | 7/2002 | Ishida et al. |
| 2002/0090749 | A1 | 7/2002 | Simmons |
| 2002/0092894 | A1 | 7/2002 | Wang et al. |
| 2002/0113296 | A1 | 8/2002 | Cho et al. |
| 2002/0121680 | A1 | 9/2002 | Ahn et al. |
| 2002/0132391 | A1 | 9/2002 | Saia et al. |
| 2002/0173080 | A1 | 11/2002 | Saia et al. |
| 2002/0179986 | A1 | 12/2002 | Orcutt et al. |
| 2002/0185715 | A1 | 12/2002 | Honer et al. |
| 2003/0002265 | A1 | 1/2003 | Simmons |
| 2003/0006502 | A1 | 1/2003 | Karpman |
| 2003/0020062 | A1 | 1/2003 | Faris |
| 2003/0026081 | A1 | 2/2003 | Liu et al. |
| 2003/0043868 | A1 | 3/2003 | Stewart et al. |
| 2003/0066351 | A1 | 4/2003 | Weinberg et al. |
| 2003/0075792 | A1 | 4/2003 | Ruhland |
| 2003/0095343 | A1 | 5/2003 | Feldman et al. |
| 2003/0104651 | A1 | 6/2003 | Kim et al. |
| 2003/0122243 | A1 | 7/2003 | Lee et al. |
| 2003/0122244 | A1 | 7/2003 | Lin et al. |
| 2003/0122246 | A1 | 7/2003 | Lin et al. |
| 2003/0124767 | A1 | 7/2003 | Lee et al. |
| 2003/0124835 | A1 | 7/2003 | Lin et al. |
| 2003/0160021 | A1 | 8/2003 | Platt et al. |
| 2003/0178718 | A1 | 9/2003 | Ehly et al. |
| 2003/0214007 | A1 | 11/2003 | Tao et al. |
| 2003/0230798 | A1 | 12/2003 | Lin et al. |
| 2004/0066258 | A1 | 4/2004 | Cohn et al. |
| 2004/0072039 | A1 | 4/2004 | Jankowski et al. |
| 2004/0087043 | A1 | 5/2004 | Lee et al. |
| 2004/0106294 | A1 | 6/2004 | Lee et al. |
| 2004/0115856 | A1 | 6/2004 | Jung et al. |
| 2004/0140570 | A1 | 7/2004 | Higashi et al. |
| 2004/0146424 | A1 | 7/2004 | Nelles et al. |
| 2004/0166603 | A1 | 8/2004 | Carley |
| 2004/0189198 | A1 | 9/2004 | Wang et al. |
| 2004/0191955 | A1 | 9/2004 | Joshi et al. |
| 2004/0229418 | A1 | 11/2004 | Hashimoto |
| 2004/0232540 | A1 | 11/2004 | Hashimoto |
| 2004/0262754 | A1 | 12/2004 | Khan et al. |
| 2005/0023629 | A1 | 2/2005 | Ding et al. |
| 2005/0054133 | A1 | 3/2005 | Felton et al. |
| 2005/0133895 | A1 | 6/2005 | Ujiie et al. |
| 2005/0181543 | A1 | 8/2005 | Lee et al. |

FOREIGN PATENT DOCUMENTS

| | | |
|---|---|---|
| EP | 1157967 | 11/2001 |
| EP | 1433742 A2 | 6/2004 |
| JP | 01004473 | 1/2001 |
| WO | WO 01/50106 | 7/2001 |
| WO | WO 01/56921 A2 | 8/2001 |
| WO | WO 02/064497 | 8/2002 |
| WO | WO 2004/102119 | 11/2004 |

OTHER PUBLICATIONS

Schmidt, "Wafer-to-Wafer Bonding for Microstructure Formation," Invited Paper, Proceedings of the IEEE, vol. 86, No. 8, pp. 1575-1583, Aug. 1998.

Correspondence from Singapore Patent Office mailed Jan. 14, 2008.

* cited by examiner

MEMS DEVICE PACKAGING METHODS

FIELD

The present invention relates generally to the field of semiconductor manufacturing and Micro Electro Mechanical Systems (MEMS). More specifically, the present invention relates to methods for packaging of MEMS and other devices.

BACKGROUND

Microelectromechanical system (MEMS) devices often employ semiconductor fabrication techniques to create small mechanical structures on the surface of a substrate such as a wafer. In the production of MEMS gyroscopes and accelerometers, for example, such fabrication techniques are often used to create a number of moving structures that can be used to sense displacement and/or acceleration in response to movement of the device about an input or rate axis. In navigational and communications systems, for example, such moving structures can be used to measure and/or detect variations in linear and/or rotational motion of an object traveling through space. In other applications, such as automotive systems, for example, such moving structures can be used in vehicle dynamic control (VDC) systems and antilock braking system (ABS) to sense changes in vehicle and/or tire motion.

The packaging of such MEMS devices remains a significant hurdle in the overall fabrication process. In many cases, MEMS die include a MEMS side and a back side. The back side of the MEMS die is often bonded to the floor of a cavity in a MEMS package. Wire bond pads on the MEMS side of the MEMS die are typically wire bonded to bond pads in or along the MEMS package cavity. Finally, a package lid is typically secured to the top of the MEMS package to provide a hermitic seal for the MEMS package cavity. In some cases, the lid is secured in a vacuum or partial vacuum to provide a desired environment for the enclosed MEMS device. When a partial vacuum is used, and in some embodiments, an inert gas may be introduced when the lid is secured to the top of the MEMS package so that an inert gas is back filled into the enclosure housing the MEMS device, but this is not required.

Due to their size and composition, the mechanical structures of many MEMS devices are susceptible to damage in high-G applications, and from particles, moisture or other such contaminants that can become entrained within the MEMS package cavity. In addition, and in some cases, the difficulty in accurately regulating the pressure within the MEMS package cavity during the fabrication process can affect the performance characteristics of the MEMS device, often reducing its efficacy in detecting subtle changes in motion. As such, there is a need for robust packaging solutions for MEMS devices that offer superior vacuum performance and/or increased protection in some environments such as high-G environments, while also providing high volume throughput and low cost during the fabrication process.

SUMMARY

The present invention relates to the packaging of MEMS and other devices. More specifically, the present invention relates to robust packaging solutions for such devices, which may result in superior vacuum performance and/or superior protection against high-G environments, while also providing high volume throughput and low cost during the fabrication process.

In one illustrative embodiment, a method for packaging a MEMS device such as a MEMS gyroscope or MEMS accelerometer is provided. A MEMS die is provided that includes a MEMS device, a seal ring that extends around the MEMS device, and one or more bond pads electrically coupled to the MEMS device. A MEMS package is also provided that includes a seal ring and bond pads that are adapted to be in alignment or in registration with the seal ring and bond pads of the MEMS die, respectively. A cavity or recess may be provided in the upper surface of the MEMS package for receiving the MEMS device on the MEMS side of the MEMS die. In some cases, the seal ring and the one or more bond pads of the MEMS die and MEMS package may be positioned laterally outside of the cavity or recess.

The MEMS die may be positioned over the MEMS package with the MEMS side of the MEMS die facing the MEMS package such that the seal ring and the one or more bond pads of the MEMS die are in alignment with the seal ring and bonds of the MEMS package. The MEMS device may extend into the cavity or recess that is provided in the upper surface of the MEMS package.

In some cases, the MEMS die and MEMS package may be positioned in a vacuum chamber, where gases may be extracted to form a controlled vacuum pressure therein. The controlled vacuum pressure may be, for example, 1 atmosphere, 0.5 atmosphere, less than $100 \times 10^{-5}$ torr, less than $50 \times 10^{-5}$ torr, less than $15 \times 10^{-5}$ torr, or less than $10 \times 10^{-5}$ torr. In some cases, once the gases are extracted from the vacuum chamber, one or more inert gasses may be introduced or otherwise backfilled into the chamber. The backfilled inert gas(es) may be at any pressure, but in some cases, may be less than $10 \times 10^{-2}$ torr, less than $50 \times 10^{-3}$ torr, less than $20 \times 10^{-3}$ torr, or less than $50 \times 10^{-4}$ torr. For some applications, the backfilled inert gas(es) may be about $18 \times 10^{-3}$ torr. In certain embodiments, a getter may be provided in the interior chamber and may be activated, if desired.

While in the controlled environment, the MEMS die and MEMS package may be brought together, and heat and/or pressure may be applied to secure the MEMS die to the MEMS package and to form a hermetically sealed interior chamber surrounding the MEMS device. Simultaneously, the seal rings and the bond pads of the MEMS die and the MEMS package may be bonded. In some cases, the seal rings by be secured by soldering, eutectic bonding, thermo-compression bonding, resistance welding, adhesives, or by any other suitable attachment process. Likewise, the bond pads of the MEMS die and the MEMS package may be secured together by soldering, eutectic bonding, thermo-compression bonding, resistance welding, adhesives, or by any other suitable attachment process. It is contemplated that the seal rings may be secured by one attachment process, and the bond pads may be secured with the same or different attachment process, as desired. For example, the seal rings may be secured by soldering, and the bond pads may be secured by thermo-compression bonding, or visa versa. When the seal rings are secured by soldering, the seal rings may be made from a material or material system that allows solder to wet to the MEMS die and MEMS package. In some cases, a solder pre-form is provided and placed between the seal rings of the MEMS die and the MEMS package to help form the seal between the seal rings.

In some cases, the MEMS package may be picked and placed into a bonding chamber. The MEMS package may be photo-registered (e.g. using pattern recognition) for placement accuracy. The MEMS die may in some cases be placed into a flipper station that flips the MEMS die so that the MEMS side of the MEMS die faces down toward the MEMS package. The MEMS die may then be picked by a tool head and photo-registered (e.g. using pattern recognition) for placement accuracy. The tool head may move the MEMS die into position over the MEMS package. A desired environment may be provided in the bonding chamber. Heat may be applied to the MEMS die and/or MEMS package, sometimes via the tool head, which may melt the solder pre-form and/or prepare the MEMS package for thermo-compression bonding with the MEMS die. The tool head may also apply force to the MEMS die to help form the die bond, creating a hermitically sealed chamber with the MEMS device therein and electrically connected the bond pads to the MEMS package bond pads. The chamber may then be cooled and vented.

DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized. While the fabrication of MEMS inertial sensors such as MEMS gyroscopes and MEMS accelerometers is specifically discussed, it should be understood that the fabrication steps and structures described herein can be utilized in the packaging of other types of MEMS devices such as electrostatic actuators, optical lenses, RF switches, relay switches, microbolometers, and/or any other suitable device (MEMS or not), as desired.

Figure 1:
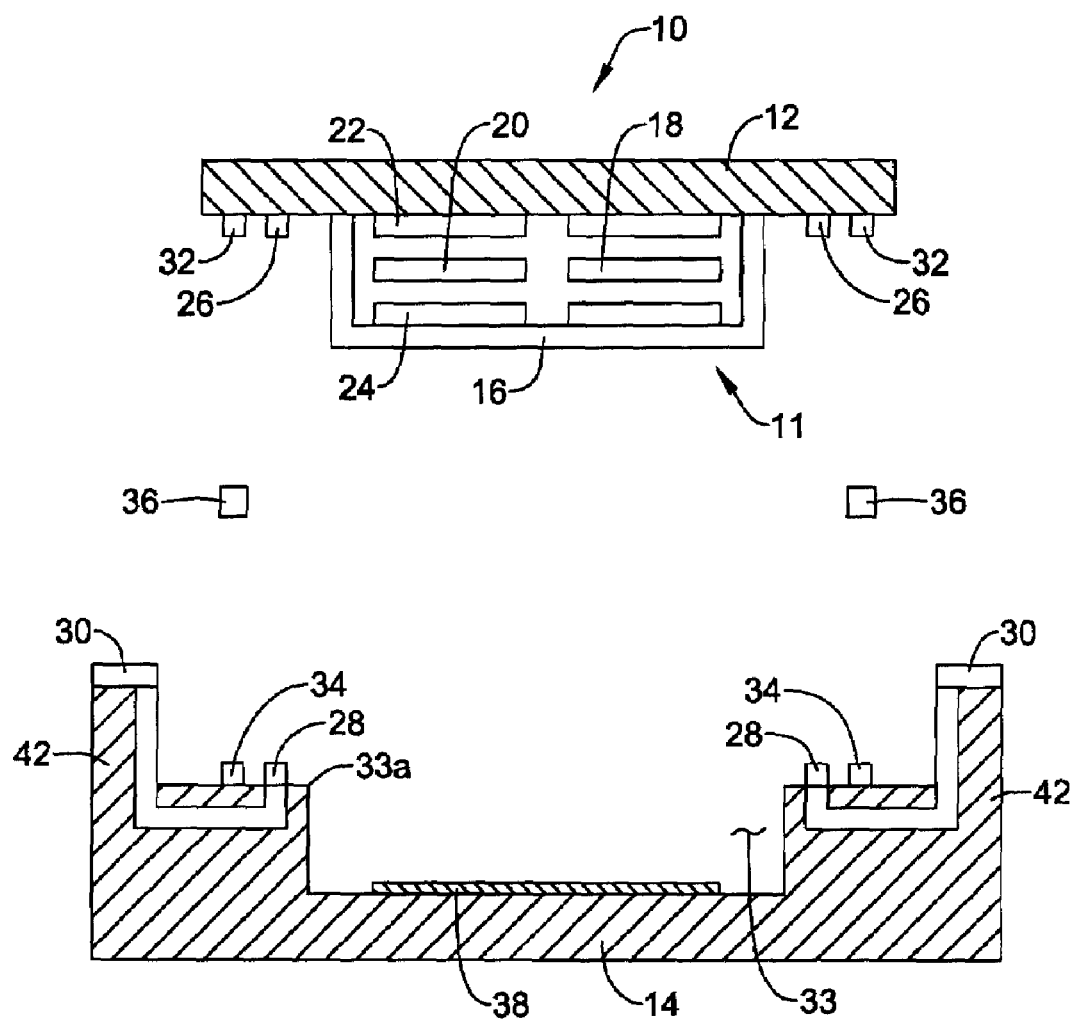
FIG. 1 is a schematic cross-sectional side view of an illustrative MEMS die, solder pre-form and MEMS package.
Figure 4:
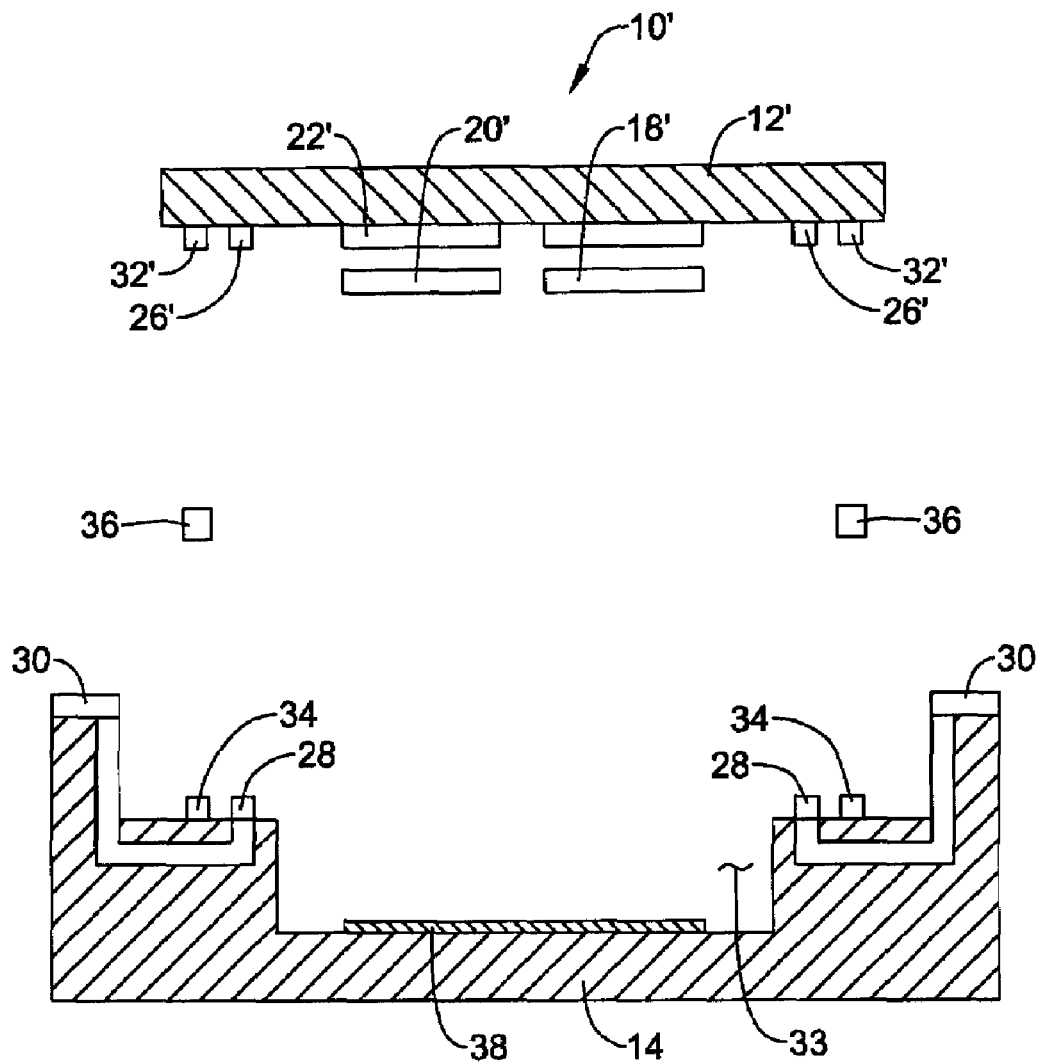
FIG. 4 is a schematic cross-sectional side view of another illustrative MEMS die, solder pre-form and MEMS package.

Referring now to FIG. 1, an illustrative method of packaging a MEMS device will now be described. The illustrative method begins with the steps of providing a MEMS die, generally shown at 10, and in the embodiment shown, having a MEMS gyroscope device 11 secured to a substrate 12. MEMS gyroscopes are often used to sense angular displacement or movement. In many cases, MEMS gyroscopes includes two proof masses that are suspended above a substrate, and are driven electrostatically 180° out of phase along a drive plane. A lower sense plate is often provided under each of the proof masses, often directly on the substrate, to detect deflections in the positions of the proof masses caused by rotation or angular displacement of the gyroscope sensor. In FIG. 1, an upper sense plate 24 is also provided above the proof masses to increase the sensitivity of the gyroscope, but this is not required. For example, in FIG. 4, a similar MEMS die 10' is shown without an upper sense plate.

In the illustrative embodiment shown in FIG. 1, MEMS gyroscope 11 includes moving components 18 and 20 (e.g. proof masses), and corresponding sense plates 22 and 24. Sense plate 24 may be supported by a support structure 16. In some cases, the MEMS gyroscope 11 may be made by micromachining a silicon substrate, the result of which is bonded to a glass (e.g. Pyrex™) substrate 12. In some cases, the glass substrate 12 may include one or more patterned metal layers that form, for example, lower sense plates 22 and well as I/O traces. This, however, is only illustrative, and it is contemplated that the MEMS die 10 may be made from any number of materials or material systems including, for example, quartz, silicon, gallium arsenide, germanium, glass, and/or any other suitable material. It should also be understood that other types of MEMS or other devices (e.g. accelerometers, electrostatic actuators, optical lenses, RF switches, relay switches, microbolometers, etc.) can be packaged in accordance with the present invention, as desired.

The illustrative MEMS die 10 includes a number of bond pads 26. The bond pads 26 are electrically connected (not illustrated) to the MEMS device 11, and in particular to one or more sense plates 22, 24, one or more proof masses 20, and/or other components or parts of the MEMS device 11, as desired. The bond pads 26 may be connected by leads or traces running on, for example, a surface of the substrate 12, as desired. The bond pads 26 may be positioned between a patterned seal ring 32 and the MEMS device 11, but this is not required. For example, one or more bond pads 26a may be positioned outside of patterned seal ring 32 (see FIG. 2).

Each bond pad 26 may include a protrusion of material such as gold or lead or any material or combination of materials suitable to promote the formation of an electrical connection between the bond pad on the MEMS die 10 and the corresponding bond pad on the MEMS package 14, as further described below. The protrusion may be a solid layer or may be a plurality of bumps or concentric rings, as desired.

In some embodiments, the MEMS die 10 may also include a patterned seal ring 32. The patterned seal ring 32 may be formed by a deposition of material or other suitable technique. When a soldering process is used to bond the MEMS die 10 to the MEMS package 14 along the seal ring 32, the seal ring 32 may be made from gold, lead, tin, aluminum, platinum or other suitable materials or combination of materials suitable for providing a good wetting surface for the solder. Of course, if the sealing mechanism does not rely on solder, the patterned seal ring 32 may be made from a different material or may not be provided at all. For example, a glass frit seal may be used along the seal ring 32 to bond and seal the MEMS die 10 to the MEMS package 14, particularly if the MEMS die 10 and/or MEMS package 14 include ceramic or the like. In another example, when a thermo-compression bonding process is used to bond the MEMS die 10 to the MEMS package 14 along the seal ring 32, the seal ring 32 may include a bonding material such as gold, silver, lead, tin, aluminum, or the like, which after sufficient heat and pressure are applied, will form the desired thermo-compression bond.

The seal ring 32 may completely encircle the MEMS device 11, and in some cases, the bond pads 26. Patterned seal ring 32 may be electrically isolated from the MEMS device 11 and from the bond pads 26. The electrical isolation may be made particularly robust when, for example, resistance welding is used to bond the MEMS die 10 to the MEMS package 14 along the seal ring 32.

Figure 3:
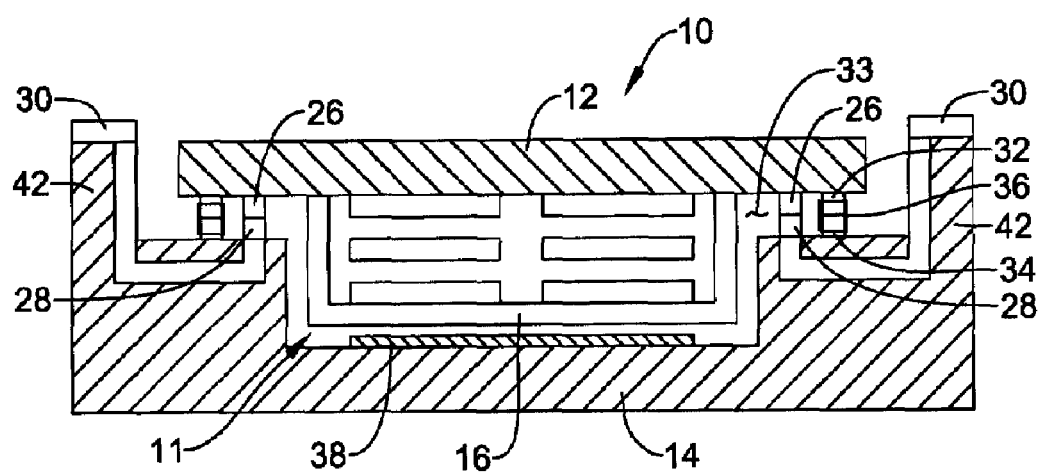
FIG. 3 is a schematic cross-sectional side view of the illustrative MEMS die, solder pre-form and MEMS package of FIGS. 1-2 after assembly.
Figure 5:
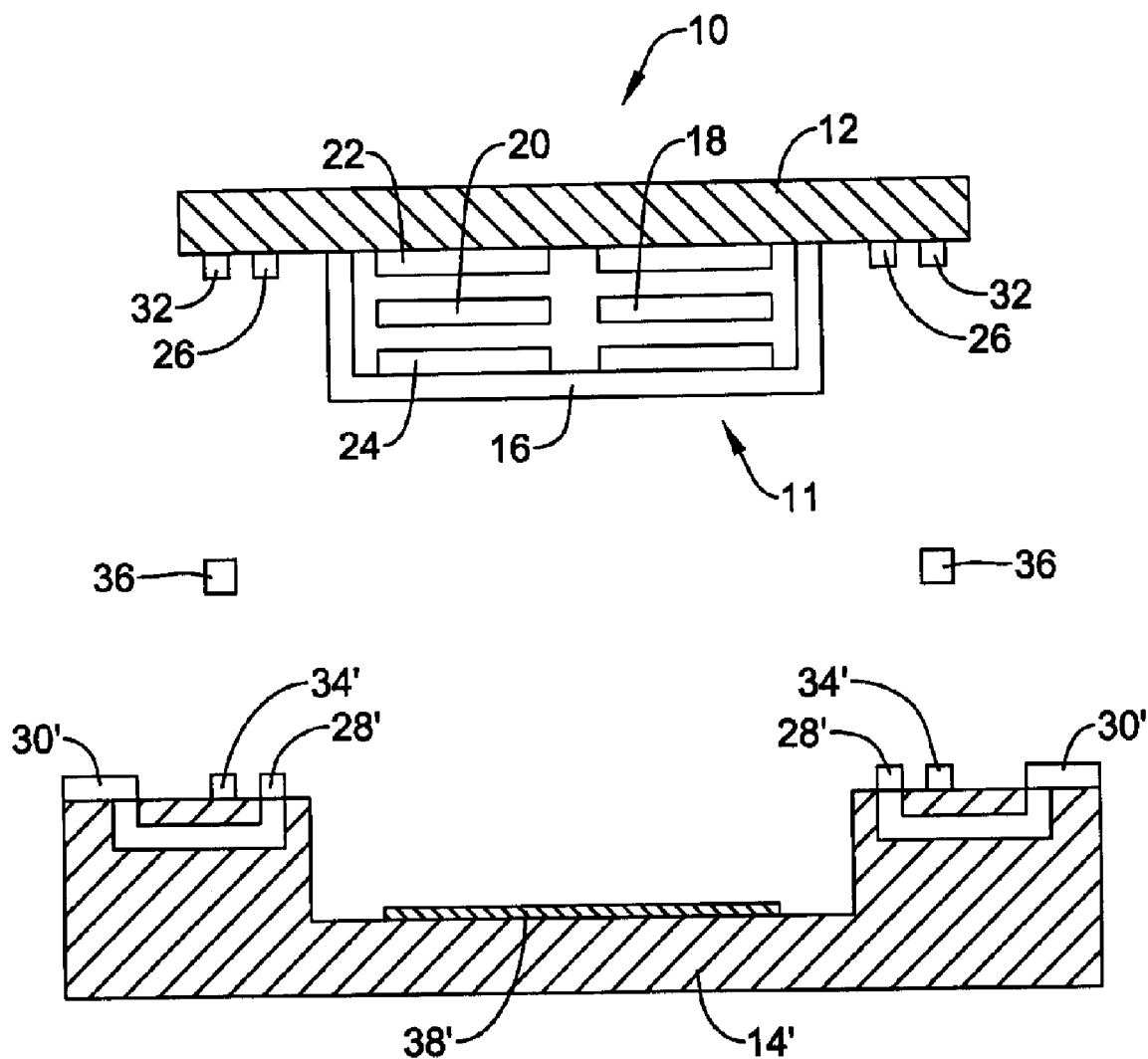
FIG. 5 is a schematic cross-sectional side view of yet another MEMS die, solder pre-form and MEMS package.

The illustrative MEMS package 14 shown in FIG. 1 includes bond pads 28 and/or 28a that are configured to be in registration with or otherwise mate with bond pads 26 and/or 26a of MEMS die 10. In the illustrative embodiment, bond pads 28 and 28a are electrically connected with leads 30, which permit the MEMS package 14 to be connected to a larger circuit, such as to bond pads on a printed circuit board (not shown). As can be seen in FIG. 3, the leads 30 may be provided on risers 42 and extend above the MEMS die 10 after final assembly so that the leads 30 can be used to mount the resulting package directly onto a printed wiring board, multi-chip package or other structure, as desired. Alternatively, and as shown in FIG. 5, the leads 30' need not extend above the MEMS die 10, in which case a hole, recess or other suitable structure may be provided in the printed wiring board, multi-chip package or other structure to accommodate the MEMS die 10, or a raised ring or other structure may extend up from the printed wiring board, multi-chip package or other structure to accommodate the MEMS die 10.

MEMS package 14 (or 14' in FIG. 5) may be made from any number of materials or material systems including, for example, ceramic, quartz, silicon, glass or other suitable materials. In some cases, the materials used for MEMS package 14 may be selected to help reduce or relieve mechanical stress and/or strain that may occur between the MEMS die 10 and the MEMS package 14 as the components go through various temperatures during operation and/or fabrication.

As noted above, the MEMS package 14 may include a patterned seal ring 34 that is configured to be in registration or mate with the seal ring 32 of the MEMS die 10. The seal ring 34 may be formed like seal ring 32 or may be formed using techniques suitable to the material of the MEMS package 14. The seal ring 34 may be electrically isolated from bond pads 28 and leads 30.

The MEMS package 14 may include a cavity 33 with a cavity perimeter 33a, which is adapted to receive part of the MEMS die 10, such as the MEMS device 11 (see FIG. 3). A getter 38 may be provided on a surface of the cavity 33 or on another suitable surface such as structure 16 of the MEMS device 11. The getter may be deposited using sputtering, resistive evaporation, e-beam evaporation or other suitable deposition technique and may be made from zirconium, titanium, boron, cobalt, calcium, strontium, thorium, combinations thereof or other suitable getter material. The getter may be selected to chemically absorb some or all of the gases anticipated to outgas into the cavity 33, such as water vapor, oxygen, carbon monoxide, carbon dioxide, nitrogen, hydrogen, and/or other gases, as desired.

In some cases, a solder pre-form 36 may be provided. The solder pre-form 36 may be sized to correspond to patterned seal rings 32 and 34. Solder pre-form 36 may be formed of indium, lead, tin, gold, other suitable metals or suitable alloys thereof. The solder pre-form 36 may be a separate component placed on the MEMS package 14 during the assembly process. In one illustrative embodiment, solder pre-form 36 is a solder layer deposited onto MEMS package 14 or MEMS die 10 using deposition or other suitable technique.

Figure 2:
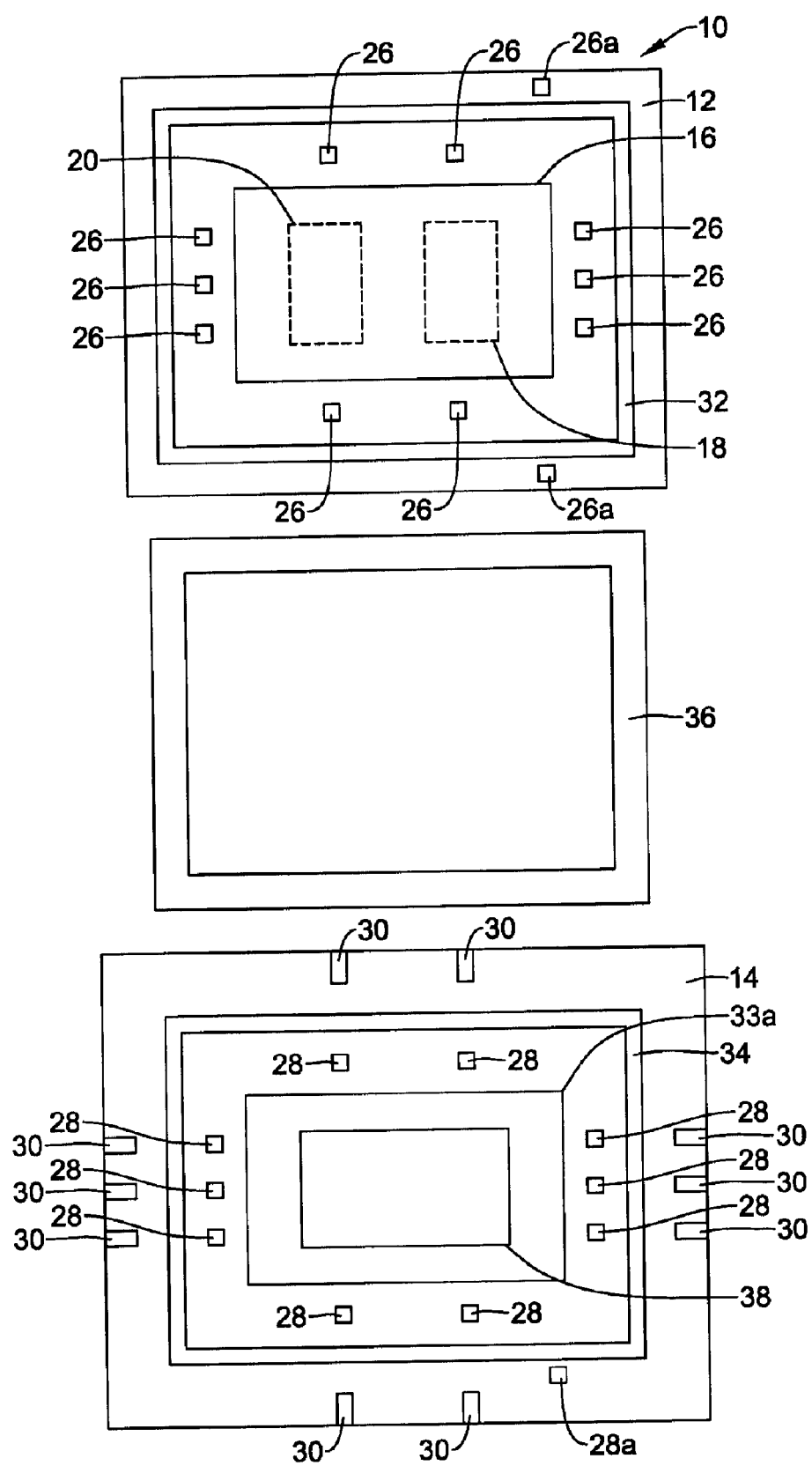
FIG. 2 is schematic top view of the MEMS die, solder pre-form, and MEMS package of FIG. 1.

FIG. 2 is schematic view depicting the top of the MEMS package 14, the bottom of the MEMS die 10, and the solder pre-form 36 of FIG. 1. The solder pre-form 36 and seal rings 32 and 34 are shown as having generally the same shape so they mate with each other to form a seal during processing. They are shown as generally rectangular but may be any desired shape. Bond pads 26 and 28 are configured so that they too will mate during the sealing process, and form electrical connections between the MEMS die 10 and the MEMS package 14.

When a solder is used to form the seal between the MEMS die 10 and the MEMS package 14, the MEMS package 14 may be picked and placed into a bonding chamber, and a solder pre-form 36 may be placed on seal ring 34. The position of the MEMS package 14 may be sensed or verified using photo-registration (e.g. using pattern recognition) or any other suitable technique, as desired. A MEMS die 10 may then be picked and placed, sometimes using a flipper station to first flip the MEMS die 10 so that the MEMS side of the MEMS die 10 faces the MEMS package 14. A tool may be provided to pick up the MEMS die 10 from the back side. The MEMS die 10 may be photo-registered (e.g. using pattern recognition) for placement accuracy, if desired. One illustrative tool may include a pressure plate for applying pressure to the MEMS die 10 opposite the seal ring and/or the bond pads. The pressure plate may surround a vacuum cup by which the MEMS die 10 is picked.

When so provided, heat may be applied, sometimes via the tool, to melt the solder perform and/or prepare the MEMS die 10 and/or MEMS package 14 for bonding. The MEMS die 10 may in some cases be kept at a lower temperature, if desired, or brought to the same temperature as the MEMS package 14.

In some cases, a controlled environment may be created in the bonding chamber. For example, gases may be extracted from the bonding chamber to form a controlled vacuum pressure therein. The controlled vacuum pressure may be, for example, 1 atmosphere, 0.5 atmosphere, less than $100 \times 10^{-5}$ torr, less than $50 \times 10^{-5}$ torr, less than $15 \times 10^{-5}$ torr, or less than $10 \times 10^{-5}$ torr. In some cases, once the gases are extracted from the bonding chamber, one or more inert gasses may be introduced or otherwise backfilled into the chamber. The backfilled inert gas(es) may be at any pressure, but in some cases, may be less than $10 \times 10^{-2}$ torr, less than $50 \times 10^{-3}$ torr, less than $20 \times 10^{-3}$ torr, or less than $50 \times 10^{-4}$ torr. For some applications, the backfilled inert gas(es) may be about $18 \times 10^{-3}$ torr.

The tool may then bring the MEMS die 10 into engagement with the MEMS package 14, and may apply heat and/or pressure to help form the seal between the seal rings and to simultaneously form electrical connections between corresponding bond pads of the MEMS die 10 and the MEMS package 14. The now formed MEMS package may include the MEMS device 11 in the chamber 33, as best seen in FIG. 3. The getter 38 may be activated by heat or other means, if desired.

In some cases, the bond pads of the MEMS die 10 and the bond pads of the MEMS package 14 may be secured by thermo-compression bonding. When so provided, the bond pads of the MEMS die 10 and/or the MEMS package 14 may includes bumps formed from a bonding material such as gold, silver, lead, tin, aluminum, or the like. In some embodiments, the bonding material is formed of a single material such as either gold or aluminum. In other embodiments, the bonding material is formed of different materials.

A bonding force can then be applied between the MEMS die 10 and the MEMS package 14 which is sufficient to secure the MEMS die 10 to the MEMS package 14. This bonding force can be any useful force such as, for example, at least 25,000 kg force, or 50,000 kg force, or 100,000 kg force per cumulative gram of bonding material used for all bond pads. While the bonding force is applied, the bonding material may be heated sufficient to aid in securing the MEMS die 10 to the MEMS package 14. The heat can be any useful amount sufficient to raise the temperature of the bonding material to a temperature greater than 300, 350, 450, or 500 degrees C., as desired. In some cases, the bond pads may be thermo-compression bonded in accordance with co-pending U.S. patent application Ser. No. 10/878,845, filed Jun. 28, 2004, and entitled "Methods and Apparatus For Attaching A Die To A Substrate", which is incorporated herein by reference.

Of course, other suitable equipment and techniques may be used to package the MEMS device 10. For example, a hinged chamber may be provided that flips the MEMS die 10 over to the MEMS package 14. Alternatively, or in addition, the entire process may take place in a larger vacuum chamber so that multiple MEMS die 10 may be simultaneously bonded to multiple corresponding MEMS packages 14, as desired. It is also contemplated that the operability of the MEMS device may be verified prior to or after the MEMS die and the MEMS package are secured together.

Having thus described the several embodiments of the present invention, those of skill in the art will readily appreciate that other embodiments may be made and used which fall within the scope of the claims attached hereto. Numerous advantages of the invention covered by this document have been set forth in the foregoing description. It will be understood that this disclosure is, in many respects, only illustrative. Changes may be made in details, particularly in matters of shape, size and arrangement of parts without exceeding the scope of the invention.

What is claimed is:

1. A method of packaging a MEMS device, comprising the steps of:
    providing a MEMS die having a MEMS device substantially enclosed within a support structure, wherein the MEMS die has bond pads disposed thereon;
    providing a MEMS package having a recess and bond pads disposed adjacent to the recess;
    positioning the MEMS die over the MEMS package;
    aligning the support structure substantially enclosing the MEMS device of the MEMS die with the recess of the MEMS package, and aligning at least some of the bond pads of the MEMS die with at least some of the bond pads of the MEMS package;
    inserting the MEMS die and MEMS package into a chamber and producing a controlled environment therein; and
    sealing the MEMS die and MEMS package together along a ring to form a package having a hermetically sealed interior chamber that includes the support structure substantially enclosing the MEMS device, as well as forming electrical connections between selected bond pads of the MEMS die with selected bond pads of the MEMS package.

2. The method of claim 1 wherein the step of sealing further comprises the step of forming the hermetically sealed interior chamber at a controlled vacuum pressure.

3. The method of claim 1 further comprising the steps of:
    providing a solder pre-form; and placing the solder pre-form between the MEMS die and the MEMS package along the ring.

4. The method of claim 3, wherein the solder pre-form has a melting temperature and further comprising the step of raising the temperature of the solder pre-form to the melting temperature.

5. The method of claim 1 wherein the MEMS device is a MEMS gyroscope.

6. The method of claim 1 wherein the MEMS device is a MEMS accelerometer.

7. The method of claim 1, further comprising the step of verifying the operability of the MEMS device prior to the step of sealing the MEMS package and the MEMS die together.

8. The method of claim 1, further comprising the step of verifying the operability of the MEMS device electronically subsequent to the step of sealing the MEMS package and the MEMS die together.

9. The method of claim 3, wherein the MEMS die includes a seal ring, and the MEMS package includes a corresponding seal ring, wherein the seal ring of the MEMS die and the seal ring of the MEMS package are aligned with the solder pre-form.

10. The method of claim 9, wherein the MEMS die seal ring comprises a material selected from the group of gold, aluminum, silver, tin, lead, and combinations thereof.

11. The method of claim 1, wherein the MEMS die and MEMS package are sealed together along the ring by a glass frit bond.

12. The method of claim 1, further comprising the step of providing a getter in the hermetically sealed interior chamber.

13. The method of claim 12, wherein the getter is a thin film getter.

14. The method of claim 1, wherein the step of sealing the MEMS die and the MEMS package together further comprises sealing the MEMS die and MEMS package using thermo-compression bonding.

15. The method of claim 1, wherein the step of sealing the MEMS die and the MEMS package together further comprises sealing the MEMS die and MEMS package using resistance welding.

16. The method of claim 1, wherein the step of sealing the MEMS die and the MEMS package together further comprises sealing the MEMS die and MEMS package using soldering.

17. The method of claim 1, wherein the step of sealing the MEMS die and the MEMS package together further comprises sealing the MEMS die and MEMS package using eutectic bonding.

18. The method of claim 1, further comprising the steps of placing the MEMS package into a bonding chamber, and photo-registering the MEMS package subsequent to placing the MEMS package into the bonding chamber.

19. The method of claim 1, further comprising the steps of picking the MEMS die up with a tool, and photo-registering the MEMS die subsequent to the step of picking the MEMS die up with the tool.

20. The method of claim 1 wherein the controlled environment is at a pressure of 1.0 atmosphere or less.

21. The method of claim 1 wherein the controlled environment is at a pressure of 0.5 atmospheres or less.

22. The method of claim 1 wherein the step of inserting the MEMS die and MEMS package into the chamber further comprises the step of evacuating the chamber to a reduced pressure and then at least partially backfilling the chamber with an inert gas.

23. The method of claim 22 wherein the chamber is at least partially backfilled with an inert gas to a pressure of less than $10 \times 10^{-2}$ torr.

24. The method of claim 22 wherein the chamber is at least partially backfilled with an inert gas to a pressure of less than $50 \times 10^{-3}$ torr.

25. The method of claim 22 wherein the chamber is at least partially backfilled with an inert gas to a pressure of less than $20 \times 10^{-3}$ torr.

26. The method of claim 1 wherein the controlled environment is at a pressure of less than $100 \times 10^{-5}$ torr.

27. The method of claim 1 wherein the controlled environment is at a pressure of less than $50 \times 10^{-5}$ torr.

28. The method of claim 1 wherein the controlled environment is at a pressure of less than $15 \times 10^{-5}$ torr.

* * * * *